(12) United States Patent
Kinzer et al.

(10) Patent No.: US 6,838,735 B1
(45) Date of Patent: Jan. 4, 2005

(54) TRENCH FET WITH NON OVERLAPPING POLY AND REMOTE CONTACT THEREFOR

(75) Inventors: Daniel M. Kinzer, El Segundo, CA (US); Ritu Sodhi, Redondo Beach, CA (US); Mark Pavier, Guildford (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/512,497

(22) Filed: Feb. 24, 2000

(51) Int. Cl.$^7$ .......................... H01L 29/76; H01L 29/94
(52) U.S. Cl. ...................... 257/365; 257/270; 257/271; 257/328; 257/329; 257/330; 257/331; 257/341
(58) Field of Search ................................ 257/327–332, 257/339–342, 365, 270–271, 587–589

(56) References Cited

U.S. PATENT DOCUMENTS

| | | | | |
|---|---|---|---|---|
| 4,791,462 A | * | 12/1988 | Blanchard et al. | 257/260 |
| 5,021,846 A | * | 6/1991 | Ueno | 357/23.4 |
| 5,106,770 A | * | 4/1992 | Bulat et al. | 437/40 |
| 5,258,635 A | * | 11/1993 | Nitayama et al. | 257/329 |
| 5,321,289 A | * | 6/1994 | Baba et al. | 257/78 |
| 5,468,982 A | * | 11/1995 | Hshieh et al. | 257/331 |
| 5,763,915 A | * | 6/1998 | Hshieh et al. | 257/330 |
| 6,110,799 A | * | 8/2000 | Huang | 438/430 |
| 6,157,049 A | * | 12/2000 | Mitlehner et al. | 257/77 |
| 6,462,376 B1 | * | 10/2002 | Wahl et al. | 257/331 |
| 6,476,443 B1 | * | 11/2002 | Kinzer | 257/329 |
| 6,541,818 B2 | * | 4/2003 | Pfirsch et al. | 257/331 |
| 2002/0074585 A1 | * | 6/2002 | Tsang et al. | 257/302 |

FOREIGN PATENT DOCUMENTS

| | | | |
|---|---|---|---|
| JP | 62 206874 | * | 9/1987 |
| JP | 4-162572 | * | 6/1992 |
| JP | 11-284174 | * | 10/1999 |
| WO | WO 00/42665 | * | 7/2000 |

* cited by examiner

Primary Examiner—Nathan J. Flynn
Assistant Examiner—Ahmed N. Sefer
(74) Attorney, Agent, or Firm—Ostrolenk, Faber, Gerb & Soffen, LLP (57) ABSTRACT

A power MOSFET has a plurality of spaced rows of parallel coextensive trenches. The trenches are lined with a gate oxide and are filled with conductive polysilicon. Spaced narrow polysilicon strips overlie the silicon surface and connects adjacent trenches to one another. The source contact is made at a location remote from the trenches and between the rows of trenches. The trenches are 1.8 microns deep, are 0.6 microns wide and are spaced by about 0.6 microns or greater. The device has a very low figure of merit and is useful especially in low voltage circuits.

22 Claims, 11 Drawing Sheets

DIRECTION OF ELONGATION

TRENCH FET WITH NON OVERLAPPING POLY AND REMOTE CONTACT THEREFOR

FIELD OF THE INVENTION

This invention relates to MOSgated semiconductor devices and more specifically, relates to such devices with a trench geometry and a remote contact structure. This application is an improvement of copending application Ser. No. 09/416,796, filed Oct. 13, 1999 (IR-1461) and entitled MOSGATED DEVICE WITH TRENCH STRUCTURE AND REMOTE CONTACT AND PROCESS FOR ITS MANUFACTURE.

More specifically, the present invention employs narrow strips of polysilicon to connect together the trench gate polysilicon formed in spaced parallel trenches, thereby to reduce gate to source capacitance $C_{GS}$.

BACKGROUND OF THE INVENTION

MOSgated devices are well known and may have a planar channel geometry or a trench channel geometry.

In the planar geometry version, spaced channel regions are diffused into the surface of a chip and MOSgates cover the invertible channel regions which are coplanar with one another. Such structures are useful over a wide range of breakdown voltages.

In the trench geometry version, invertible channel regions are formed along the vertical walls of U-shaped trenches etched into the silicon surface. A source contact is connected to the channel region and source region for each separate trench unit. Trench devices are preferably used for lower breakdown voltage ratings, for example, less than about 100 volts.

Both planar geometry devices and trench geometry devices may be formed with channel regions of a spaced polygonal or spaced stripe arrangement.

Trench geometry devices have an inherently lower capacitance between gate and source, and thus a lower charge $Q_g$ than planar devices. Since an important figure of merit of a MOSFET is the product of $Q_g$ and the on-resistance $R_{DSON}$, trench devices are frequently desired for low voltage applications requiring a minimum switching loss such as the MOSFETs used in low voltage power supplies for supplying power from a battery to a portable electronic device such as a lap top computer.

Trench device geometries have not permitted the best trench density for minimizing the $R_{DSON}$. Therefore, while the trench device has a low $Q_g$, complex manufacturing processes are needed to produce a low $R_{DSON}$ as well.

Thus, it is desirable to provide a trench geometry MOSgated device such as a MOSFET, which has a minimized $Q_g$ and $R_{DSON}$ but is capable of inexpensive and reliable production techniques.

BRIEF DESCRIPTION OF THE INVENTION

A novel trench structure and manufacturing process is provided in which both a very low $Q_{GD}$ and $R_{DSON}$ is provided through the use of novel spaced polysilicon strips for connecting the polysilicon gates in a plurality of spaced adjacent trenches, with contacts to the source and channel region being remote from the trench areas. As a result, the trenches can be more closely spaced, to increase total channel width per unit area. The $Q_g$ is also reduced by the use of a unique trench mesa height and control of the trench bottom relative to the P/N junction which defines the bottom of the invertible channel along the walls of the trench. Further and in accordance with the invention, the reduced area of the narrow polysilicon strips for connecting the polysilicon trench structures further reduces $Q_g$ or the gate to source capacitance $C_{GS}$. More specifically, a trench depth (or mesa height) of about 1.8 microns is used, with the trench bottom penetrating the P/N junction by about 0.2 to 0.25 microns.

The novel trench structure is also preferred to have any desired length and a width of about 0.6 microns. The trenches may be arranged in parallel, coextensive groups with a spacing greater than about 0.6 microns. The trenches are filled with a separate conductive polysilicon body which acts as the device gate. The separate elongated polysilicon bodies are connected to one another by spaced perpendicular polysilicon strips extending perpendicularly across the trenches. Each parallel set of trenches are spaced from an adjacent set by a strip of untrenched area running perpendicular to the elongated trenches. The source/base contacts may formed in this strip, remotely from the trench structures, but connected to the channel region and source region for each trench.

By making contact only to the source region, a bidirectional conductive device can be formed.

The novel device lends itself to a simplified manufacturing process having a reduced number of masks and critical mask alignments and has a minimized $C_{GD}$ and thus a minimized figure of merit.

DETAILED DESCRIPTION OF THE DRAWINGS

Figure 1:
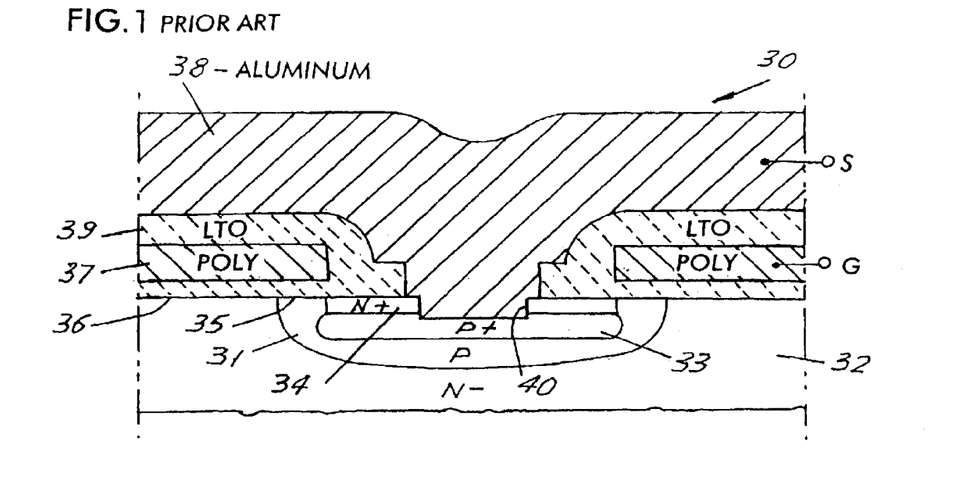
FIG. 1 is a cross-section of one cell of a prior art planar geometry MOSFET.

FIG. 1 shows, in cross-section, a single power MOSFET cell 30 of a power MOSFET made in accordance with the disclosure of U.S. Pat. No. 5,731,604, the disclosure of which is incorporated herein by reference. Cell 30 is one of a large number of spaced polygonal planar cells which each include a P-type channel diffusion region 31 (sometimes referred to as a base region) in a low resistivity, epitaxially formed substrate 32. Channel region 31 receives a $P^+$ diffusion 33 and an $N^+$ source diffusion 34. The area between the outer periphery of source region 34 at its upper surface, and extending to the periphery of P region 31 defines a planar invertible channel region 35. Channel region 35 is covered by a layer of silicon dioxide 36, which defines a gate insulation layer and the gate insulation layer is covered by a conductive polysilicon layer 37 which is a conductive gate electrode sometimes referred to as gate poly. The polysilicon layer 37 is insulated from a continuous aluminum source electrode 38 by an insulation layer 39 which usually is a deposited low temperature oxide or an LTO layer. Other insulation materials can be used. A drain electrode, not shown, is fixed to the bottom of a 375 micron thick $N^{++}$ body (not shown) which carries the N-epitaxial layer 32. Note that source electrode 38 contacts both $N^+$ source region 34 and $P^+$ region 33 in the etched opening 40 in silicon 32.

In typical devices using the cell structure shown in FIG. 1, and designed to withstand a breakdown voltage of lower than about 40 volts, for example, a $V_{DS}$ of 24 volts, and turned on by a voltage $V_{GS}$ between gate 37 and source 38 of 10 volts, the source diffusion 34 has a depth of about 0.4 microns and the P base 31 has a depth of about 1.9 microns. The capacitance between the gate 37 and the drain 32 is relatively high in a planar design such as that of FIG. 1 so that the charge $Q_{GD}$ is high, for example, greater than about 12.3. Thus, in a planar cellular design with a reduced on-resistance of about 9.3 milliohms, the figure of merit or $R_{DSON}$ X $Q_{GD}$ is about 115 (mΩnc).

Figure 2:
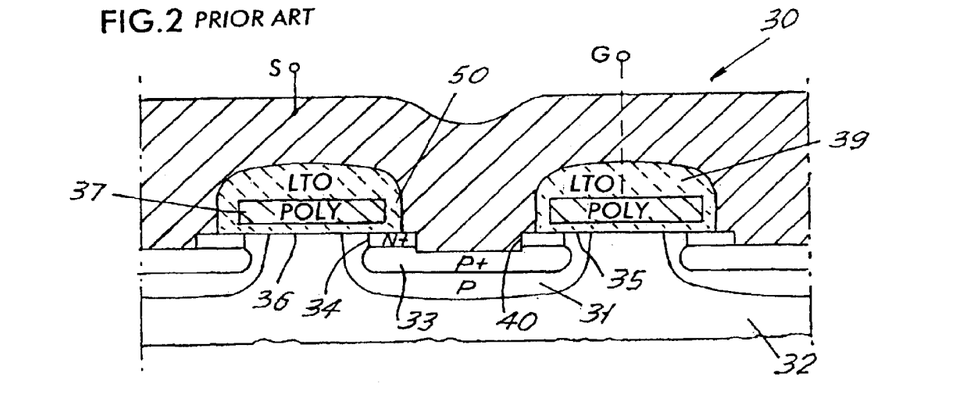
FIG. 2 is a cross-section of one cell of a second prior art planar geometry MOSFET.

FIG. 2 shows another cell configuration which is similar to that of FIG. 1 and similar numerals designate similar structures. The structure shown in FIG. 2 is that of copending application Ser. No. 08/956,062 filed Oct. 22, 1997 (IR-1232), the disclosure of which is incorporated by reference into this application. The device of FIG. 2 differs basically from that of FIG. 1 only in using a side insulation spacer insulation 50 for LTO 39, rather than photo lithography step to define the contact opening 40. For the same reverse voltage and gate voltage given above FIG. 1, and using a source depth of 0.1 microns and base depth of 1.5 microns, the figure of merit for such devices exceeds about 128 (mΩnc).

It is desirable to reduce this high figure of merit particularly for low voltage devices to be used in relatively high frequency applications where switching loss is to be reduced as much as possible. The figure of merit can be reduced in a stripe trench design by careful optimization of the trench depth and P base depth.

Figure 3:
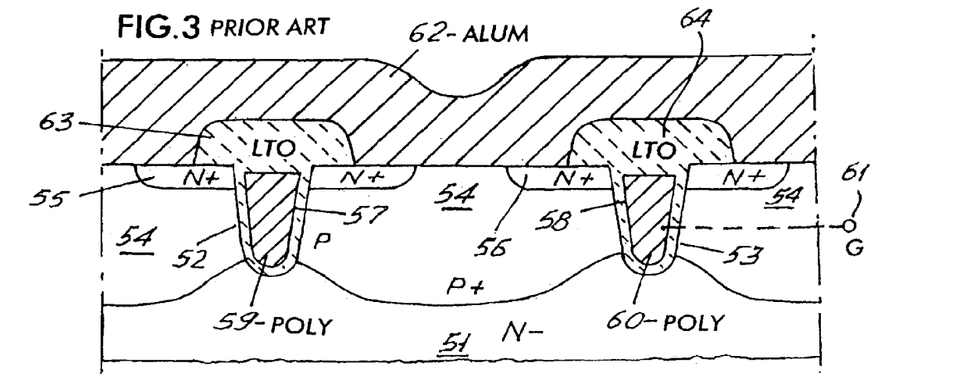
FIG. 3 is a cross-section of one cell element of a prior art trench geometry device.

FIG. 3 schematically shows the cross-section of a known trench device which has an $N^-$ epitaxial substrate 51 which has a plurality of parallel trenches, two of which are shown as trenches 52 and 53, formed in a P type channel 54. $N^+$ source regions 55–56 extend the length of the trenches, as shown for trench 52. Trenches 52 and 53 are then lined with gate oxides 57 and 58 respectively and are filled with polysilicon strips 59 and 60 respectively. Strips 59 and 60 are necessarily interrupted at the top surface of silicon 51, but are connected together at some other region of the die, not shown, and are connected to a common gate electrode 61. The tops of polysilicon strips 59 and 60 and a portion of source regions 55 and 56 are insulated from an aluminum source electrode 62 by LTO strips 63 and 64.

The structure of FIG. 3 is a trench structure in which invertible channels are formed in the P material lining the vertical walls of trenches 52 and 53 and which extend from sources 55–56 to N-region 51. The structure has a low $R_{DSON}$ and so was thought to be the preferred structure for power MOSgated devices intended for use at low voltages, for example, voltages lower than about 40 volts.

The present invention provides a novel design for trench type devices which provides simplified manufacturing techniques and an improved trade off of such variable as $Q_{GD}$ and $R_{DSON}$ to provide a low voltage device with a reduced figure of merit and reduced cost, as compared to known devices.

The structure of the device of application Ser. No. 09/416,796 (IR-1461) is shown in FIGS. 4 to 9, and one process of manufacture for the structure is shown in FIGS. 10 to 15.

Figures 4, 5:
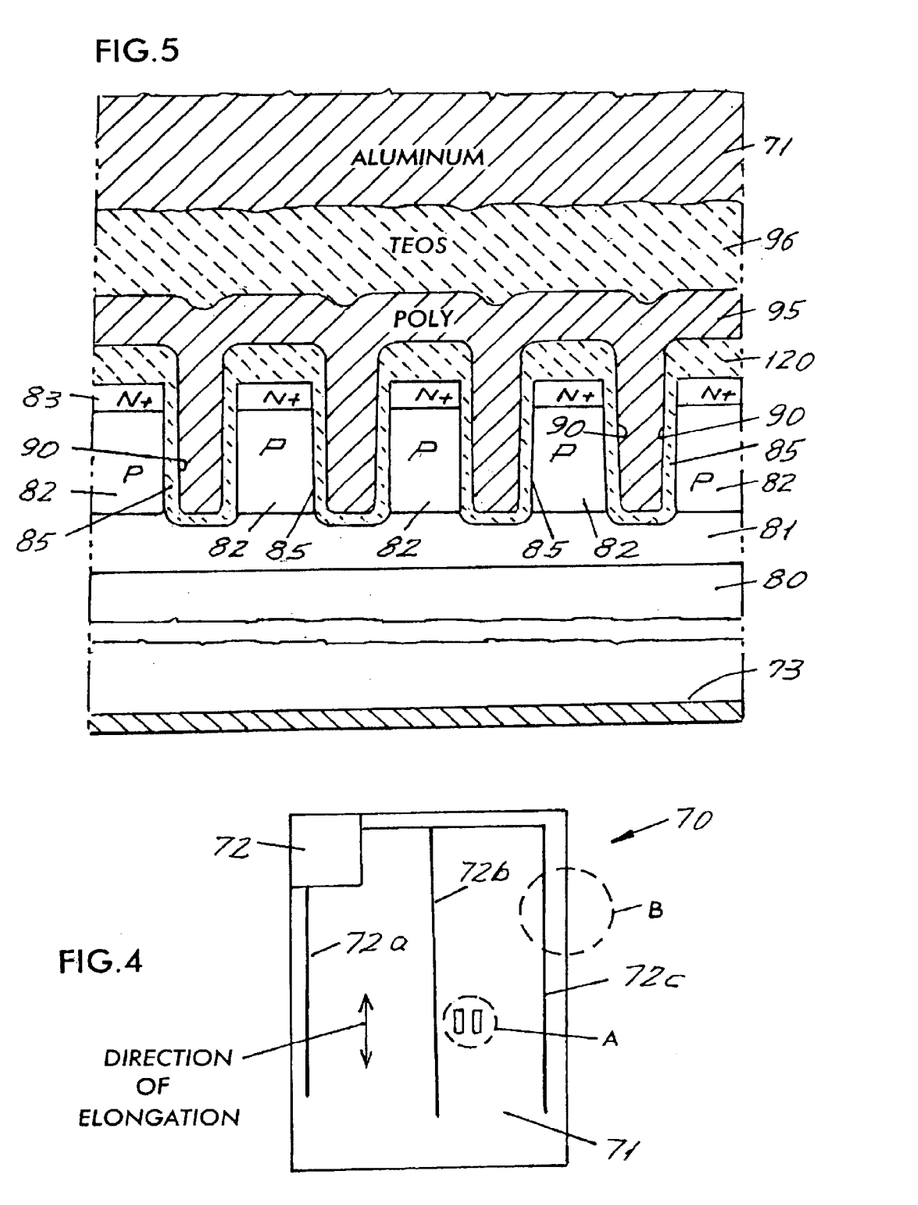
FIG. 4 is a top view of a die which may incorporate the present invention.
FIG. 5 is a cross-section of the active area of the chip of FIG. 4 at region "A" in FIG. 4 and shows the trench structure and a common polysilicon gate as in application Ser. No. 09/416,796 (IR-1461) and is a cross-section of FIG. 6 taken across section line 5—5 in FIG. 6.

Referring first to FIG. 4, there is shown the top view of a typical die 70 containing the structure of the present invention. Die 70 may have a width of 102 mils and a length of 157 mils (the largest size that can fit into an SO8 style package), although the die may have any desired dimensions. The die has a top source electrode 71, a gate pad 72 to which a polysilicon gate is connected, as will be later described, and has a bottom drain electrode 73, shown in FIG. 5.

Figure 7:
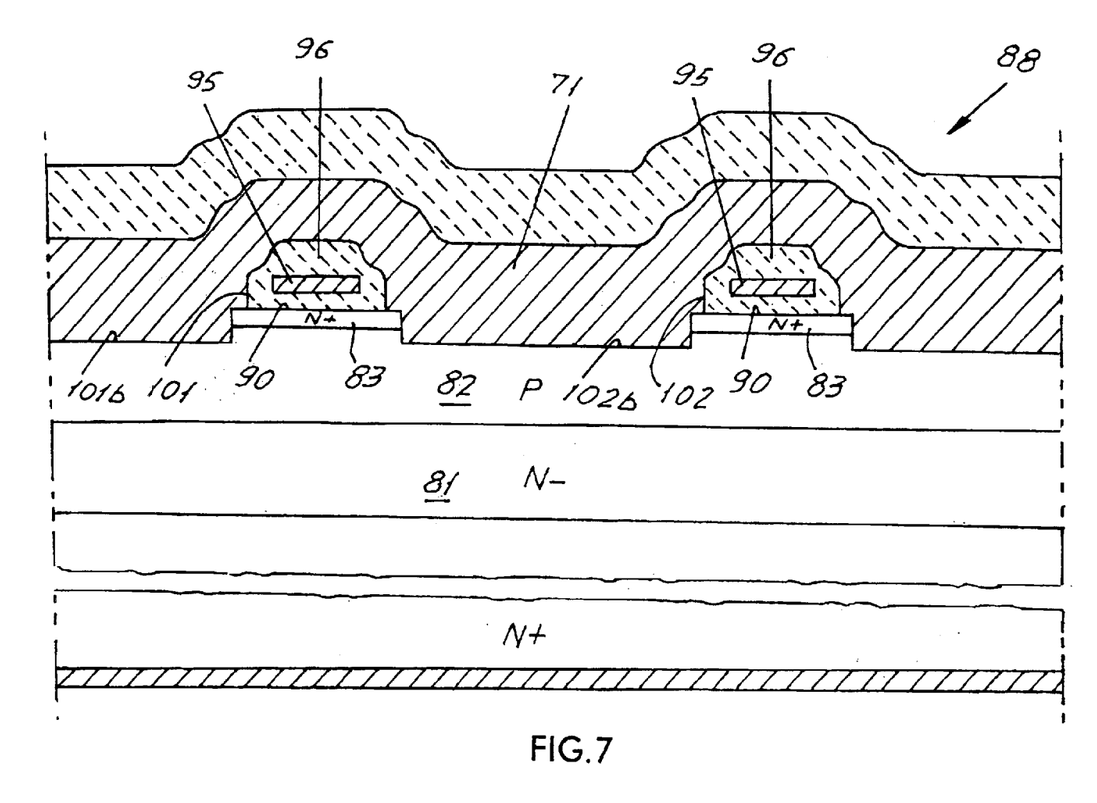
FIG. 7 is a cross-section of FIG. 6 taken across section line 7—7 in FIG. 6 to show the source contact structure between rows of trenches in FIG. 6.

A small portion of the active trench area of the die of FIG. 4, shown within circle "A" is shown in detail in FIGS. 5 and 7. A small portion of the termination of the die of FIG. 4, shown within circle "B" is shown in more detail in FIGS. 8 and 9. It will be noted that the device to be described has an improved active area utilization of almost 84%, using a reduced area termination, a small gate pad 72 (6 mil×6 mil) and a small street width (where die are separated within a wafer) of about 3.1 mils. The gate busses (not shown) extend parallel to the direction of the trenches to permit unrestricted current flow and reduced gate resistance (of about 2.5 ohms) in the die of FIG. 4.

Figure 6:
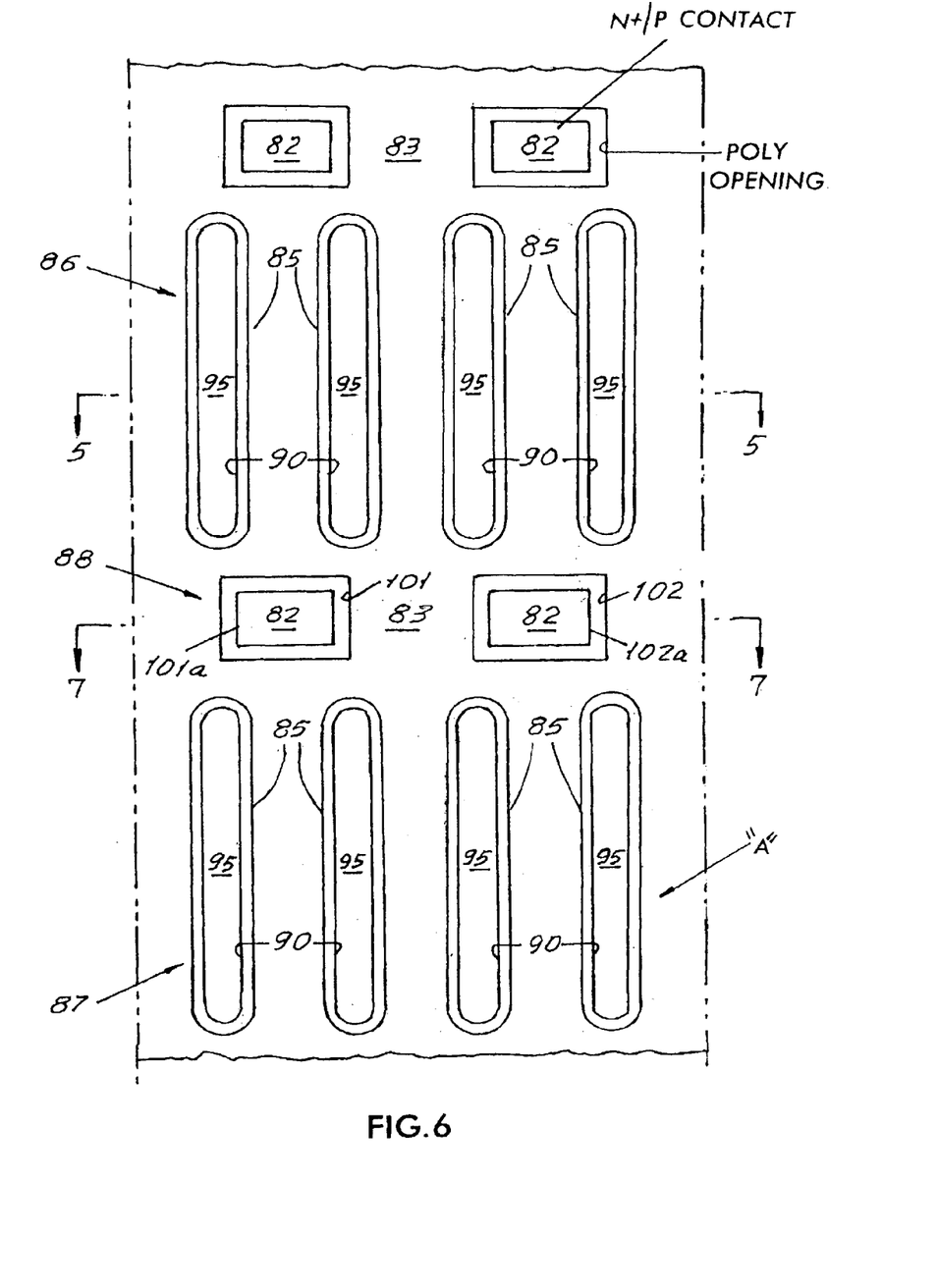
FIG. 6 is a top schematic view of region "A" of FIG. 4 to show two rows of trenches and their remote source contacts with the upper polysilicon layer removed.

The active area "A" as shown in FIGS. 5, 6 and 7 is shown for a vertical conduction type device having an $N^+$ body 80, to which drain contact 73 is connected and which receives and $N^-$ epitaxially deposited, junction receiving layer 81. A P type channel diffusion 82 is formed into the upper planar surface of $N^-$ substrate layer 81 to a first depth, for example, 1.5 to 1.6 microns. A shallow $N^+$ source region 83 is formed into the upper surface of region 81 to a second depth, for example 0.3 to 0.4 Å.

A plurality of rows of parallel, coextensive trenches 85 are then etched into the surface of substrate 81 to a third depth which is greater than the depth of P diffusion 82, preferably by 0.2 to 0.25 microns. Thus, parallel trenches 85 have a depth of about 1.8 microns, cutting through source layer 83 and channel layer 82 as shown. FIG. 6 shows the silicon surface as containing first and second rows 86 and 87 of trenches 85, separated by a central untrenched area 88 which will be later described to be the area to receive remote source/channel contacts for the device, permitting a very close high density spacing of the trenches.

Trenches 85 have a preferred width of about 0.6 microns and a length of about 5–8 microns. The trench spacing should be equal to or greater than about 0.6 microns.

The space 88 between rows 86 and 87 should be as small as possible, to conserve active trench area.

The interior of each of trenches 85 are lined with a grown silicon dioxide gate insulation layer 90 which may have a thickness of 300 to 500 Å. The interior of each of the gate oxide lined trenches is then filled with a conductive polysilicon layer 95 which acts as the device gate. Note that the polysilicon layer 95 is insulated from, but extends continuously across the upper surface of the substrate between each of the trenches 85. This is to be contrasted to the conventional polysilicon gate structure of prior art devices as shown in FIG. 3, in which the polysilicon strips of each "cell" is separated from adjacent ones by the source contact structure. An important feature of the arrangement of FIG. 3 is that the adjacent cells of FIG. 5 may be closer to one another, and more densely packed, (producing a greater channel width per unit area) with the source contact made to a location which is laterally remote from the trench.

The upper surface of the polysilicon layer is then covered with a TEOS insulator layer 96 or other suitable insulation layer to insulate the polysilicon gate electrode layer 95 from the source electrode 71.

In order to make contact to the source/channel regions which are remote from the ends of the trenches, the contact structure disclosed in U.S. Pat. No. 5,731,604 may be used, as schematically shown in FIGS. 6 and 7. Thus, a plurality of openings are made in the region 88, shown as polygonal (rectangular) etched frames 101 and 102 which encircle rectangular contact windows 101a, 102a that permit contact of aluminum source electrode 71 to the source region 83 and the channel region 82 at spaced locations along row 88 in FIG. 6. A shallow silicon trench 101b, 102b is etched in the contact window to expose the P-base 82 for contact. These contact regions can have any desired spacing from one another, and are preferably shorter in the direction of elongation of the trenches to reduce the width area needed for this source contact. Preferably, the contacts have a pitch perpendicular to the direction of elongation of the trenches of about 4.8 microns. These contacts are then connected to the shallow sources 83 at the top of each shallow trench and provide for current flow between source 71 and drain 73 in FIG. 5 when a suitable voltage applied to polysilicon 95 inverts the channel adjacent to the exterior of each trench. Current flows horizontally through the source region 83 between the trenches, and then vertically down through the channel 82 (FIG. 5) to the drain 72.

It should be noted that the structure has been illustrated to this point for an N channel device. Clearly, all conductivity types can be reversed to form a P channel device.

Figure 8:
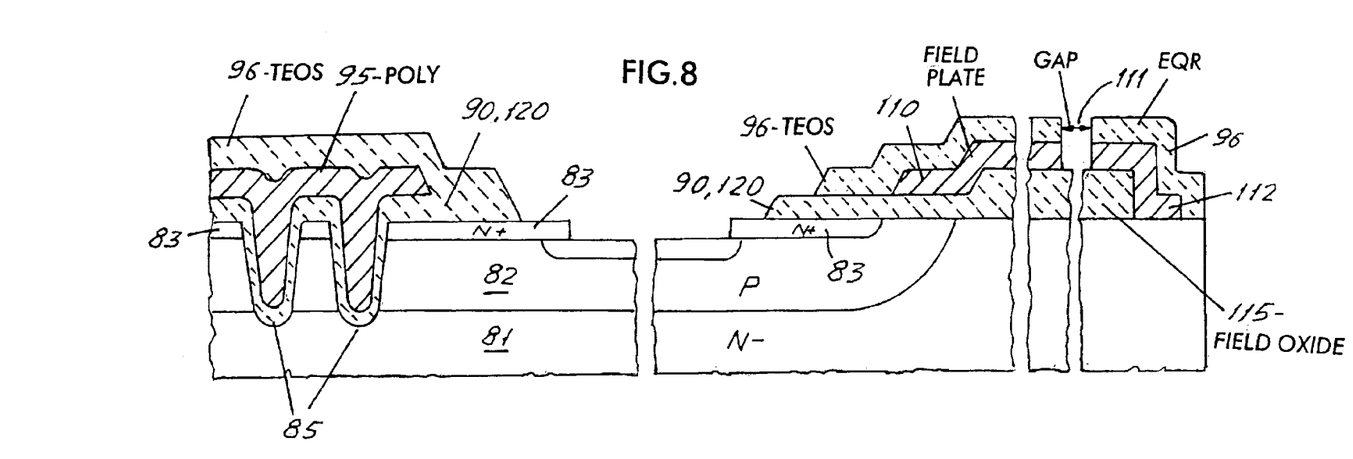
FIG. 8 is a cross-section of the die area "B" in FIG. 4 and shows the termination structure which surrounds the die of FIG. 4.
Figure 9:
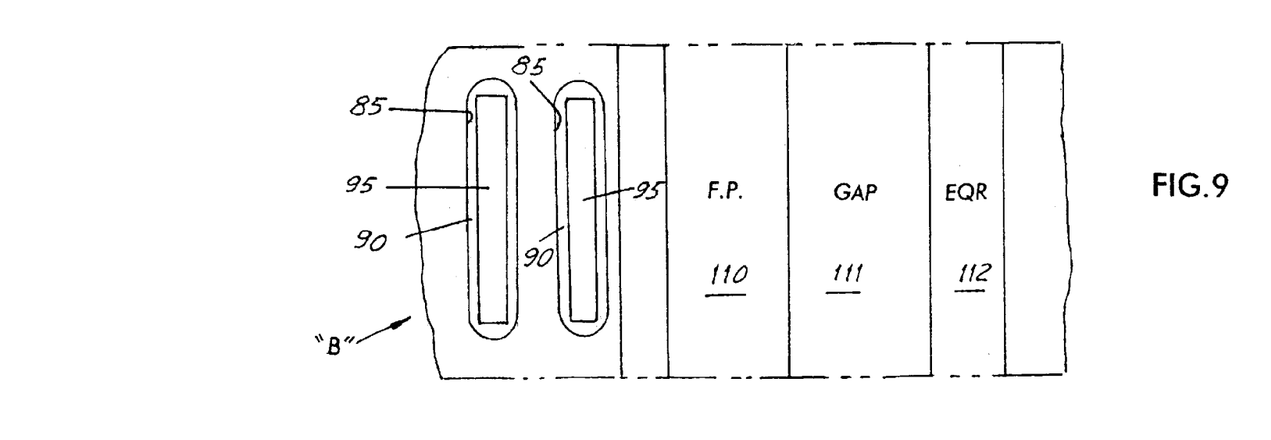
FIG. 9 is a top schematic view of the termination topology at region 5 of FIGS. 4 and 8.

FIGS. 8 and 9 schematically illustrate a termination structure which can be used for the die of FIG. 4. Thus, a small area termination may be used, comprising a polysilicon field plate 110 (defined by an extension of polysilicon layer 95), a gap 111 in the polysilicon layer 95 and an EQR ring 112, also defined by an extension of the polysilicon layer 95.

There is next described one process for the manufacture of the trench MOSgated device of FIGS. 4 to 9. The device to be made is for a power MOSFET rated at a voltage of 30 volts and having a die size of 102 by 157 mils. The numerals which described elements of the die in FIGS. 4 to 9 are used in FIGS. 10 to 15 to identify similar parts.

Figure 10:
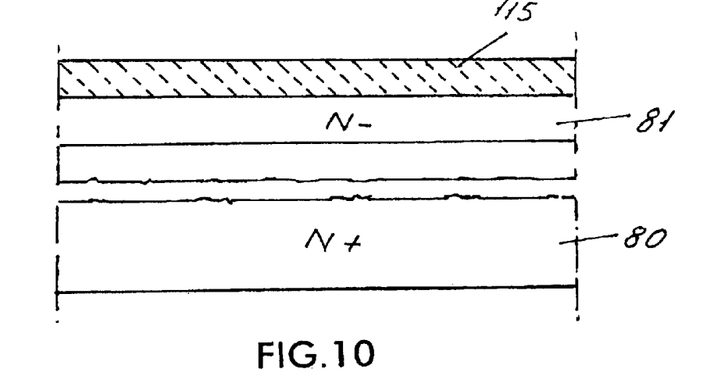
FIG. 10 is a cross-section of a small portion of a die, showing the first steps in the manufacture of the device of FIGS. 4 to 6.

The first step in the process is to select a silicon wafer having a main N[+] body 80 which is 375 microns thick and has a resistivity of 0.003 Ωcm. As shown in FIG. 10, the upper surface of the wafer has the N[−] epitaxial layer 81 grown thereon. Layer 81 is phosphorous doped and is 5 microns thick and has a resistivity of 0.2 Ωcm for a 30 volt device. A field oxide layer 115 is first grown atop layer 81 to a thickness of 7500 Å in an oxidation step in steam at 1050° C. A mask step is then carried out to mask the field oxide in the termination region and to open the active area of the device by a suitable etch and strip step.

Figure 11:
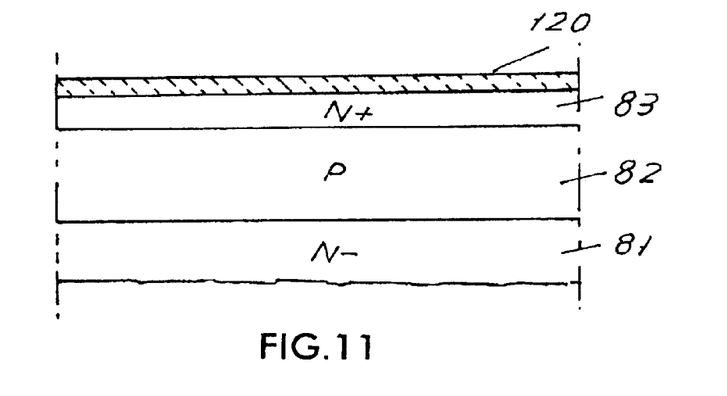
FIG. 11 is a cross-section of the die portion of FIG. 10 following diffusion steps for forming the regions which will become the source and channel regions.

Thereafter, and as shown in FIG. 11, a boron implant is carried out, to form P region 82. The boron implant dose is 8e13 at 120 KeV. The boron is then driven to a depth of 1.5 to 1.6 micron by a drive at 1175° C. for 25 minutes. The source region 83 is next formed, using an arsenic implant at a dose of 1E16 at 100 KeV. This is followed by heating at 900° C. for 60 minutes in nitrogen to preanneal the implant, and then by heating at 850° C. for 9 minutes in steam, to grow an oxide layer 120 to a thickness of about 2000 Å.

Figure 12:
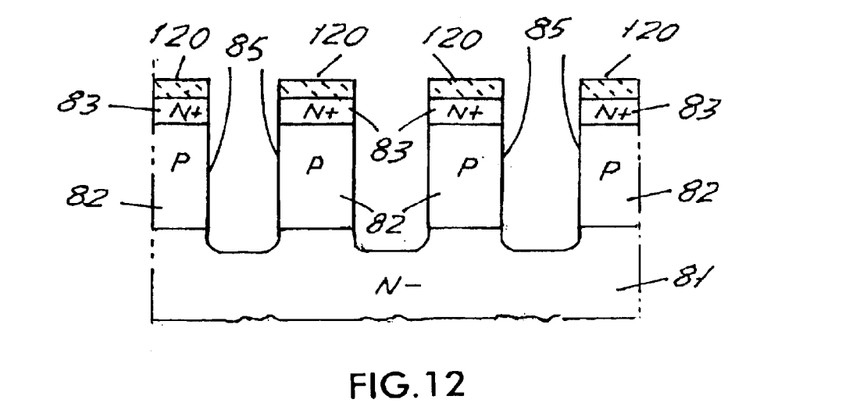
FIG. 12 is a cross-section of the structure of FIG. 11 after the formation of typical trenches.

A second mask step is then carried out to define trenches in the active area. A dry plasma etch is then carried out to etch the spaced trenches as shown in FIG. 12. The trench depth is preferably 1.7 to 1.8 microns, which has been found to lead to the most advantageous trade-off between $Q_{GD}$ and $R_{DSON}$ in the completed device.

More specifically, the trench etch should be almost 0.2 to 0.25 microns deeper than the P channel region 82. Making the trench deeper improves $R_{DSON}$ but reduces breakdown voltage. Making the trench shallower reduces $Q_{GD}$ but creates a higher $R_{DSON}$. A trench depth of about 1.8 microns and about 0.2 to 0.25 microns deeper than the P channel has been found to produce the most advantageous trade-offs between $Q_{GD}$, $R_{DSON}$ and breakdown voltage.

Since the source/channel contact is remotely located, the trench length must be carefully chosen to prevent easy failure due to a low avalanche energy (due to a long current path and a high $Rb^1$ in N[+] source regions 83). Thus, 5 microns is preferred when using a trench to trench spacing of 0.6 microns for trenches with openings of 0.6 microns. At a more medium trench density, for example, with trenches spaced by 1.2 to 1.8 microns, the trench length can be increased to about 14 microns without being unduly "weak" to avalanche energy.

Figure 13:
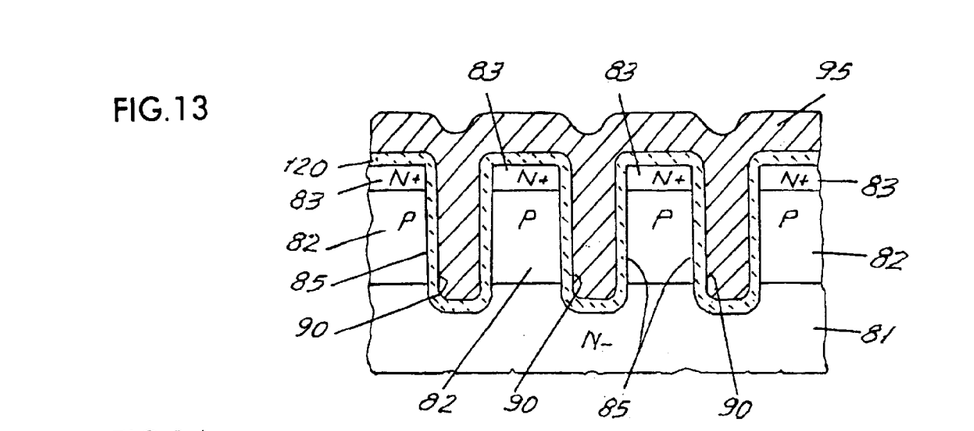
FIG. 13 is a cross-section of the structure of FIG. 12 after the formation of gate oxide in the trenches and the formation of a layer of in-situ-doped polysilicon.
Figure 14:
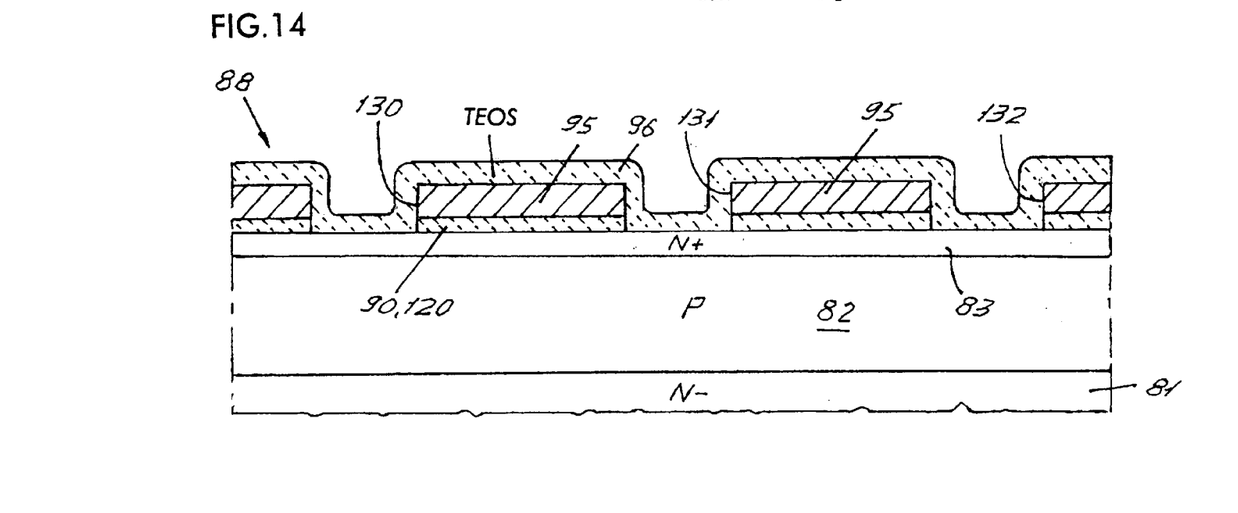
FIG. 14 is a cross-section of a portion of space between rows of trenches preparatory to the formation of the source/channel contact.

Following the trench etch step in FIG. 12, the photoresist is stripped and the wafer is deglassed and cleaned. A sacrificial oxide is next grown by heating the wafer to 950° C. in steam and then deglassing and removing the grown oxide and cleaning the wafer. A gate oxide preferably a TCA oxidation step is then carried out at 950° C. to grow the gate oxide layer 90 to a thickness of 300 to 500 Å, as shown in FIG. 13. Note that oxide layer 90 overlies the oxide 120 which spans across the silicon surface between trenches and thickens the oxide layer on the spanning surfaces.

Thereafter, and also shown in FIG. 13, the conductive polysilicon layer 95 is grown over the active surface of the device (and in the termination regions). Rather, in-situ polysilicon doping should be used in which the polysilicon is deposited with in-situ dopants, for example, using silane plus phosphine. It has been found that the use of in-situ doping leads to a reduction in threshold voltage of about 0.5 volts compared to an undoped film. Alternatively, a POCl$_3$-doped poly film can be used, if the phosphorous is driven to the bottom of the trench.

A preferred process employs the initial formation of an undoped polysilicon layer about 1000 Å thick, followed by the deposition of 6500 Å thick in-situ doped polysilicon. This process forms a polysilicon layer 95 having a thickness of 7500 Å which completely fills the interiors of che oxide coated trenches 85, and overlies the oxide over the planar silicon surface bridges between trenches.

The next step in the process employs a third polysilicon mask, used to open the polysilicon layer 95 at locations in areas such as area 88 in FIG. 6 to receive the source/channel contact, and in the termination region to form the gap 111 (FIGS. 8 and 9) in the termination area to define and separate the field plate 110 and EQR ring 112. Thus, in FIG. 14, and in area 88, the polysilicon layer 95 in patterned and then etched away to open windows 130, 131 and 132 in the polysilicon layer 95 and the underlying oxide layer 120, 90. A plasma etch is preferably used. As will be later described, and in accordance with the improvements of the present invention, a larger area of the polysilicon layer is removed, leaving only spaced strips dispersed perpendicular to the trenches and connected to and continuous with the polysilicon in each of the trenches.

A thermal oxidation (95° C. for 30 min. in TCA/O$_2$) is now done in order to have a better interface between the polysilicon and the interlayer dielectric film. The thermal oxide provides a more conformal covering over the polysilicon.

Thereafter, the TEOS layer 96 is formed to a thickness of 7500 Å.

Figure 15:
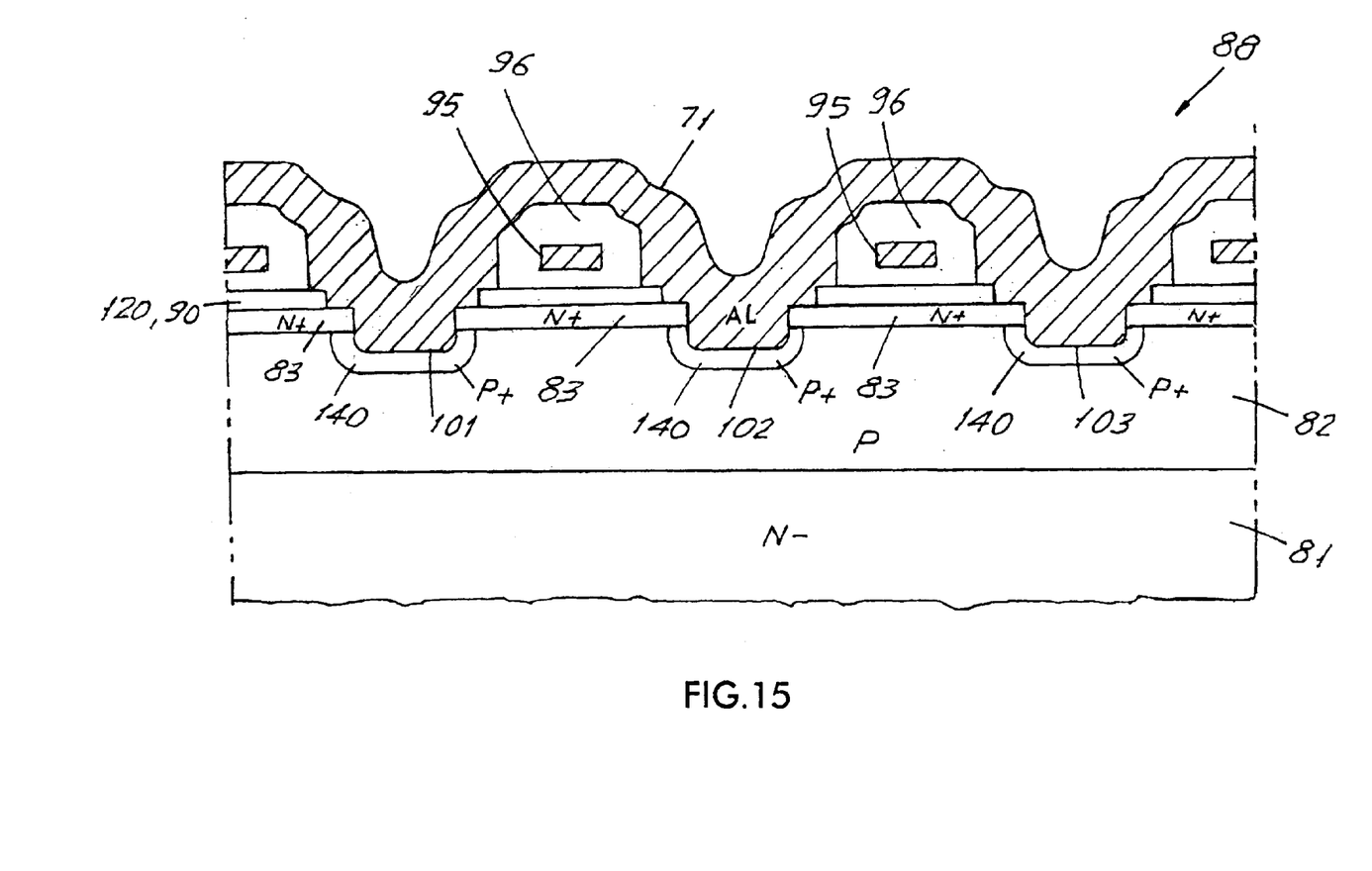
FIG. 15 is the cross-section of FIG. 14 after the formation of contact regions for the source/channel contact, and prior to the steps which complete the active regions as shown in FIG. 5.

Next, and as shown in FIG. 15, a fourth mask, which is the contact mask, is applied to define the source/channel openings in the rows such as row 88 and, using the process sequence of copending application Ser. No. 08/956,062 (IR-1232), the trenches 101, 102 and 103 are etched through the N$^+$ layer 83 and into the top of the P channel layer 82. The edge of oxide layer 120, 90 is preferably etched back slightly.

This step is followed by a heavy P$^+$ base implant 140 (not shown in FIG. 7) which is annealed at 900° C. for about 30 minutes. P$^+$ base implant 140 reduces the device R$_{b'}$ (base resistance).

The wafer is next deglassed and cleaned and the aluminum source metal 71 is applied to the device surface, making contact to the source region 83 and P channel.

A fifth mask (the metal mask) is next applied to define the gate and 72 (FIG. 4) and gate busses (not shown) which run parallel to the direction of elongation of the trenches 85.

Finally, the wafer is sintered at 425° C. for 1 hour. The bottom of N+ region 80 (FIG. 5) is then ground to reduce its thickness to about 200 microns. Preferably, the surface is first ground with a rough grind, followed by grinding with a smoother grind, followed by an etch to cause stress relief of the ground surface. A suitable back side metal 73 is then applied to the back of the device.

The wafer is then tested and the die are separated in the customary manner. The die may then be housed, for example, in SO-8 type housings.

The above described process and device is for the manufacture of a power MOSFET which has a reduced figure of merit. Numerous variations are possible to adjust the device process and to make other kinds of MOSgated device, for example, IGBTs.

In one modification, the process can be altered to make a bidirectional type of MOSFET. Thus, in making contact to the rows 88, if the aluminum source 71 in FIG. 15 contacts only the source 83 and not the channel region, then device can be used for bidirectional operation in applications with low dV/dt duty.

Figure 16:
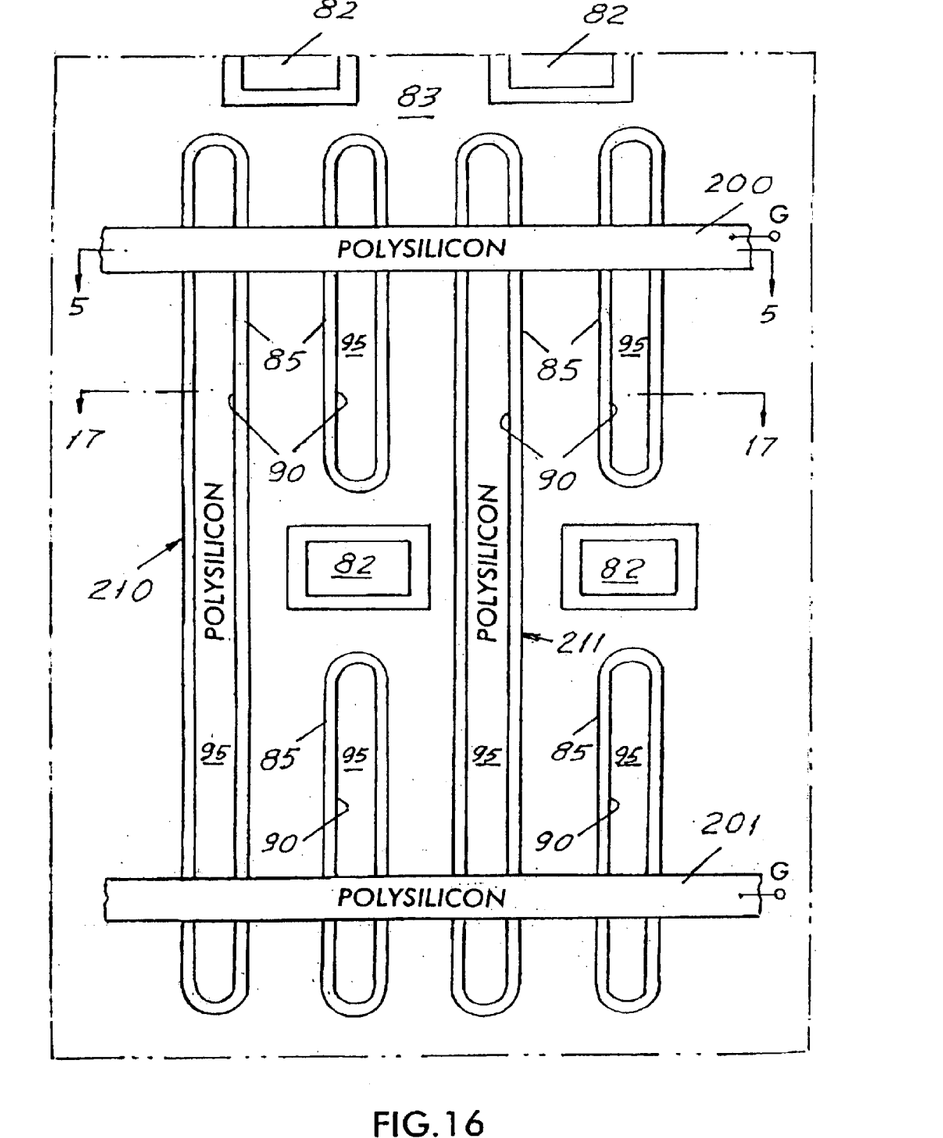
FIG. 16 is a top schematic view similar to that of FIG. 6 of the structure of the improvement of the present invention.

Referring next to FIG. 16, there is shown, in a view similar to that of FIG. 6, one embodiment of the improvement of the invention. Components similar to those of the preceding description carry the same identifying numeral.

As shown in FIG. 16, the polysilicon layer 95 found in process step 13 is plasma etched to leave only spaced polysilicon strips 200, 201 which are spaced from one another and are connected to and continuous with polysilicon strips 95 in the trenches 85. Further, the alternate trenches 85 are elongated and continuous, shown as elongated trenches 210 and 211 in FIG. 16. This novel structure produces a further reduction in C$_{GD}$ and thus Q$_C$.

The structure of FIG. 16 will have the same cross-sectional appearance when seen across section line 5—5 as is shown in FIG. 5. Its structure as seen across section line 17—17 is that shown in FIG. 17 which is similar to that of FIG. 5, except that the TEOS layer 90 contacts the surface of the die at first above the oxide layer 120 over the die surface.

Figure 18:
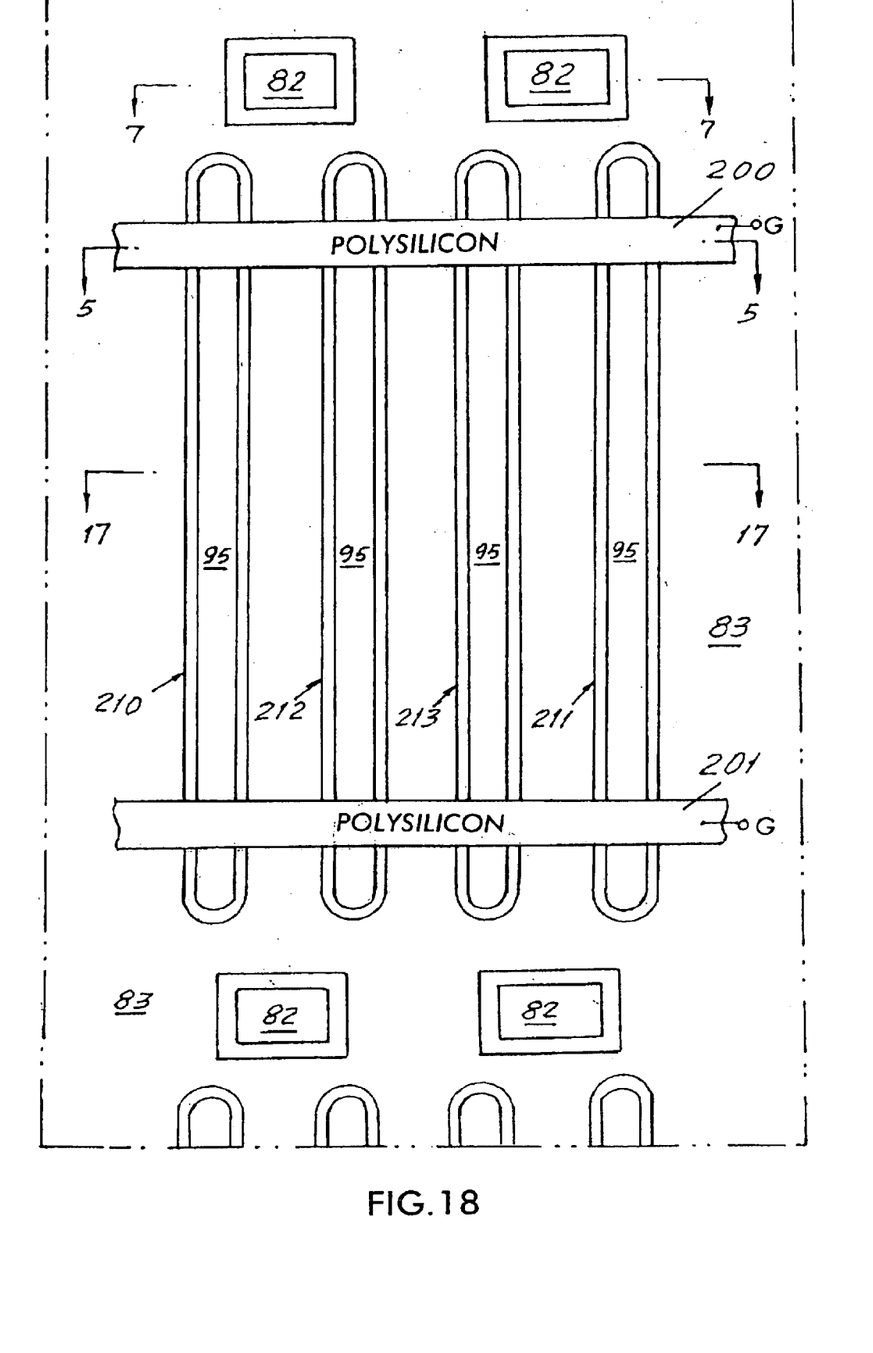
FIG. 18 is a top schematic view like that of FIG. 16 for a second embodiment of the improvement of this invention.

FIG. 18 shows a second embodiment of the invention which all trenches 210, 211, 212 and 213 are elongated and are connected at their ends by perpendicular polysilicon strips 200 and 201. The contact structures 82 are moved to a position spaced from the ends of the trenches as shown. This structure has a slightly higher R$_{DSON}$ than that of FIG. 16, but its Q$_g$ is reduced significantly.

Figure 17:
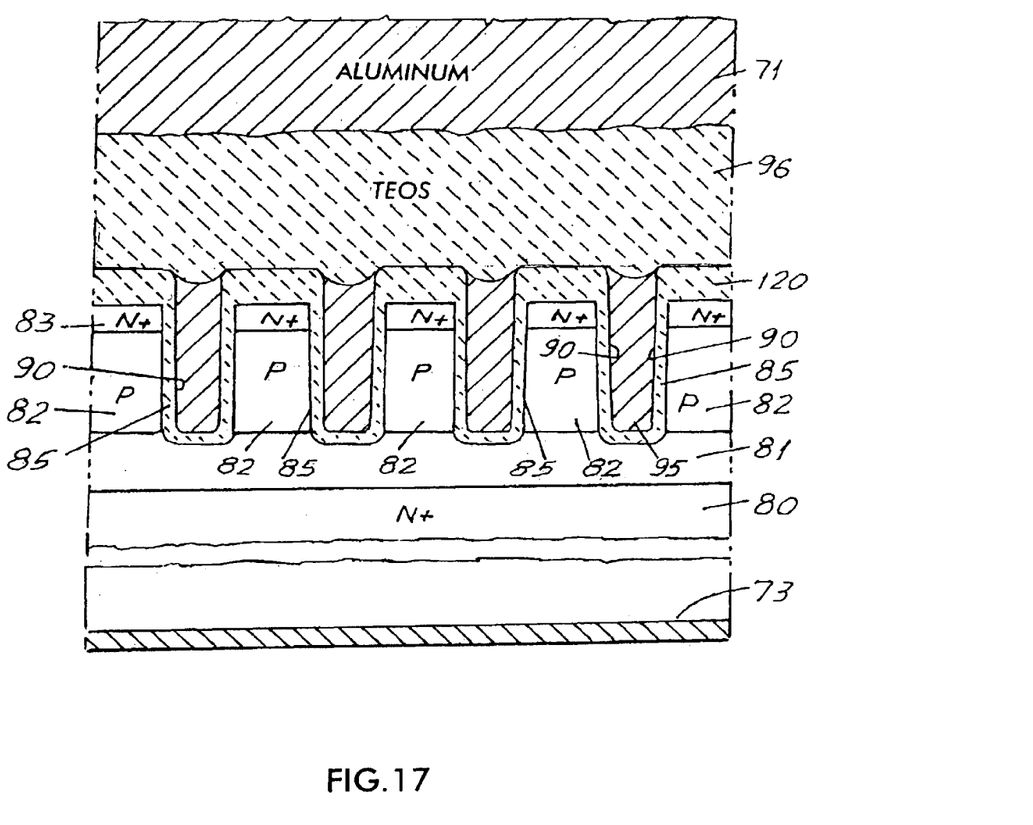
FIG. 17 is a cross-section of the structure of FIG. 16, taken across section line 17—17 in FIG. 16.

It will also be noted that the contact structure at section line 7—7 in FIG. 18 will be that shown in FIG. 7 while the structure at section lines 5—5 and 17—17 in FIG. 18 is that shown in FIGS. 5 and 17 respectively.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A MOSgated device comprising:

a semiconductor body of a first conductivity type;

a channel region of a second conductivity type formed in said semiconductor body;

a conductive region of said first conductivity type formed in said semiconductor body and extending from a first major surface of said semiconductor body to at least said channel region;

a plurality of spaced trenches extending into said semiconductor body below said channel region, each of said trenches being adjacent a mesa and each terminating at a contact region in said semiconductor body, said channel region and said conductive region extending into said contact region, and said conductive region uninterruptedly extending between each two adjacently disposed trenches;

a gate insulation layer dispose over the sidewalls and bottom of each of said trenches;

a gate electrode formed in each of said trenches over said gate insulation layer;

at least one conductive strip extending transverse to and over each of said trenches and electrically connected to each of said gate electrodes; said conductive strip being narrower than the length of said gate electrodes such that it makes contact only with a portion of each of said gate electrodes; and a remote contact formed over at least said contact region and in electrical contact with at least said conductive region.

2. A MOSgated device according to claim 1, wherein said remote contact extends through said conductive region to make contact with said channel region below said conductive region.

3. A MOSgated device according to claim 1, wherein said conductive region is a source region.

4. A MOSgated device according to claim 1, wherein said gate electrode comprises conductive polysilicon.

5. A MOSgated device according to claim 1, wherein said gate insulation layer comprises an oxide.

6. A MOSgated device according to claim 1, wherein said semiconductor body is an epitaxial silicon layer formed over a silicon substrate of the same conductivity and further comprising a second contact in electrical contact with said substrate.

7. A MOSgated device according to claim 6, wherein said second contact is a drain contact.

8. A MOSgated device according to claim 1, wherein said remote contact is a source contact.

9. A MOSgated device according to claim 1, wherein said plurality of spaced trenches are parallel to one another and are coextensive with one another.

10. A MOSgated device according to claim 1, wherein said plurality of spaced trenches are formed in a plurality of spaced rows and are parallel to one another and are coextensive with one another within each row.

11. A MOSgated device according to claim 1, wherein said trenches have a depth of about 1.8 microns.

12. A MOSgated device according to claim 1, wherein said trenches extend to about 0.2 to 0.25 microns below said channel region.

13. A MOSgated device according to claim 1, wherein said trenches have a width of about 0.6 microns and a spacing of about 0.6 microns or greater.

14. A MOSgated device according to claim 1, wherein said gate insulation is an oxide layer having a thickness greater than about 200 Å and which fully covers the interior of each of said trenches.

15. A MOSgated device comprising:

an epitaxial silicon body of a first conductivity type;

a channel region of a second conductivity type formed in said epitaxial silicon body;

a source region of said first conductivity type formed in said epitaxial silicon body and extending from a first major surface of said silicon body to at least said channel region;

a plurality of spaced trenches extending into said silicon body below said channel region, each of said trenches being adjacent a mesa and each terminating at a source contact region in said silicon body, said channel region and said source region extending into said source contact region, and said source region uninterruptedly extending between each two adjacently disposed trenches;

a gate oxide layer dispose over the sidewalls and bottom of each of said trenches;

a polysilicon gate electrode formed in each of said trenches over said gate oxide layer;

at least one conductive strip extending transverse to and over each of said trenches and electrically connected to each of said polysilicon gate electrodes; said conductive strip being narrower than the length of said polysilicon gate electrode such that it makes contact only with a portion of each of said polysilicon gate electrodes; and a remote source contact formed over at least said source contact region and in electrical contact with at least said source region.

16. A MOSgated device according to claim 15, wherein said remote source contact extends through said source region to make contact with said channel region below said source region.

17. A MOSgated device according to claim 15, further comprising a silicon substrate and a drain contact in electrical connection with said substrate, said epitaxially silicon substrate being formed over said substrate.

18. A MOSgated device according to claim 15, wherein said plurality of spaced trenches are parallel to one another and are coextensive with one another.

19. A MOSgated device according to claim 15, wherein said plurality of spaced trenches are formed in a plurality of spaced rows and are parallel to one another and are coextensive with one another within each row.

20. A MOSgated device according to claim 15, wherein said trenches have a depth of about 1.8 microns.

21. A MOSgated device according to claim 15, wherein said trenches extend to about 0.2 to 0.25 microns below said channel region.

22. A MOSgated device according to claim 15, wherein said trenches have a width of about 0.6 microns and a spacing of about 0.6 microns or greater.

\* \* \* \* \*